(12) United States Patent
Pang et al.

(10) Patent No.: US 12,464,285 B2
(45) Date of Patent: Nov. 4, 2025

(54) AUDIO CONTROLLER FOR A SEMI-ADAPTIVE ACTIVE NOISE REDUCTION DEVICE

(71) Applicant: HUAWEI TECHNOLOGIES CO., LTD., Shenzhen (CN)

(72) Inventors: Liyun Pang, Munich (DE); Fons Adriaensen, Munich (DE); Song Li, Hannover (DE); Roman Schlieper, Hannover (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 268 days.

(21) Appl. No.: 18/311,063

(22) Filed: May 2, 2023

(65) Prior Publication Data
US 2023/0362542 A1    Nov. 9, 2023

Related U.S. Application Data

(63) Continuation of application No. PCT/EP2020/080937, filed on Nov. 4, 2020.

(51) Int. Cl.
*G10K 11/178* (2006.01)
*H04R 3/04* (2006.01)
(Continued)

(52) U.S. Cl.
CPC ............... *H04R 3/04* (2013.01); *H04R 5/033* (2013.01); *H04R 5/04* (2013.01);
(Continued)

(58) Field of Classification Search
CPC .............. H04R 2460/01; H04R 1/1083; G10K 11/17853; G10K 11/17854
See application file for complete search history.

(56) References Cited

U.S. PATENT DOCUMENTS 8,693,700 B2    4/2014  Bakalos et al.
10,714,073 B1*  7/2020  Rui ................. G10K 11/17813
(Continued)

FOREIGN PATENT DOCUMENTS

CN    111052226 A    4/2020
WO    2017029550 A1  2/2017

OTHER PUBLICATIONS

Schumacher et al., "Active noise control in headsets: a new approach for broadband feedback ANC," ICASSP, Total 4 pages (May 2011).
(Continued)

*Primary Examiner* — James K Mooney
(74) *Attorney, Agent, or Firm* — Leydig, Voit & Mayer, Ltd.

(57) ABSTRACT

An audio controller for an active noise reduction, ANR, reduces an ambient noise signal. The audio controller includes processing circuitry configured to provide a fixed ANR filter configured to generate a first noise reduction signal. Moreover, the processing circuitry is further configured to provide an adaptive ANR filter. The adaptive ANR filter includes one or more adjustable filter coefficients for adapting the adaptive ANR filter and the adaptive ANR filter is configured to generate a second noise reduction signal. The processing circuitry is further configured to generate a total noise reduction signal as an adjustable weighted linear combination of the first noise reduction signal and the second noise reduction signal.

13 Claims, 12 Drawing Sheets

(51) Int. Cl.
    *H04R 5/033*    (2006.01)
    *H04R 5/04*    (2006.01)
(52) U.S. Cl.
    CPC .. *G10K 11/17853* (2018.01); *G10K 11/17854* (2018.01); *H04R 2460/01* (2013.01)

(56) References Cited

U.S. PATENT DOCUMENTS

2012/0170766 A1   7/2012  Alves et al.
2017/0053639 A1*  2/2017  Lu .................... G10K 11/17854

OTHER PUBLICATIONS

Johansson, "System modeling and identification," Prentice Hall Information and System Sciences Series, vol. 1, Prentice Hall Inc., A Simon and Schuster Company, Englewood Cliffs, NJ, Total 526 pages (Jan. 1, 1993).
Skogestad et al., "Multivariable feedback control: analysis and design," vol. 2, John Wiley and Sons, New York, Total 303 pages (Nov. 2005).
Bai et al.,, "Implementation of an active headset by using the H robust control theory," Acoustical Society of America, vol. 102, No. 4, Oct. 1997, Total 8 pages (Accepted May 1997).
Liebich et al.,"Active Noise Cancellation in Headphones by Digital Robust Feedback Control," 24th European Signal Processing Conference (EUSIPCO), Total 5 pages (Aug. 2016).

\* cited by examiner

AUDIO CONTROLLER FOR A SEMI-ADAPTIVE ACTIVE NOISE REDUCTION DEVICE

CROSS-REFERENCE TO RELATED APPLICATIONS

This application is a continuation of International Application No. PCT/EP2020/080937, filed on Nov. 4, 2020, the disclosure of which is hereby incorporated by reference in its entirety.

FIELD

The present disclosure generally refers to audio processing. More specifically, the disclosure refers to an audio controller for a semi-adaptive active noise reduction device as well as a corresponding active noise reduction method. Moreover, the disclosure refers to a semi-adaptive active noise reduction device comprising the respective audio controller, such as headphones.

BACKGROUND

Headphones are typically worn in public environments where loud ambient noises may surround users of such headphones. Active noise cancellation/reduction (ANC/ANR) headphones are therefore becoming increasingly important as they can effectively attenuate the perceived ambient noise.

ANC/ANR headphones attempt to reduce unwanted (noise) signals by active compensation using an additional sound source provided by a headphone loudspeaker. The unwanted signals are commonly defined as primary sound sources, which are located in the environment of the user. The noise signals (primary sources) are recorded by microphones mounted in the headphone to compute a corresponding anti-noise or compensation signal, which will then be played back through the headphone loudspeaker (secondary source). Ideally, the anti-noise and the unwanted noise should have the same amplitude and opposite phase at the listening position.

ANC/ANR headphones can usually be divided into three types: feedforward (FF), feedback (FB), and hybrid (FF+FB) ANC/ANR headphones. Moreover, each type can be implemented using a fixed (off-line calculated) or an adaptive filter (online interactively calculated).

For feedforward (FF) ANC/ANR a microphone mounted outside of the ear cup captures the noise. ANC/ANR data processing then processes the noise and creates the anti-noise before sending the resulting signal to the headset speaker. In the case of an adaptive FF ANC/ANR device, a further microphone mounted inside the ear cup is used to check the residual error signal and further to adapt an FF controller. For feedback (FB) ANC/ANR a microphone mounted inside the ear cup and in front of the headphone transducer captures the resulting signal in the same way the listener does (at least at low frequencies). The recorded signals are filtered through a designed controller to generate anti-noise signals. Hybrid ANC/ANR is a hybrid approach combining FF and FB ANC/ANR filters.

Fixed ANC/ANR filters are commonly applied in commercially available ANC/ANR headphones due to their robustness. However, the fixed ANC/ANR filters are not capable of adapting to changes that occur in dynamic environments (change of headphone position relative to the head, source direction, source types, etc.), resulting in a degraded ANC/ANR performance. In contrast, adaptive ANC/ANR filters can be used to adaptively compensate noises even in a dynamic environment. However, large estimation errors can be caused by sudden change of direction or type of noise, and the secondary path (transfer function between headphone transducer to error microphone). The robustness of the adaptive filter cannot always be guaranteed. Therefore, there is a need to combine fixed and adaptive filters to effectively attenuate noise in a dynamic environment while ensuring the robustness of the ANC/ANR performance.

SUMMARY

Aspects of the present disclosure provide an improved audio controller for combining fixed and adaptive ANC/ANR filters in a semi-adaptive ANC/ANR device as well as a corresponding ANC/ANR device and method.

Generally, embodiments disclosed herein provide an audio controller for a semi-adaptive ANC/ANR device, e.g. headphones, configured to combine fixed and adaptive ANC/ANR filters in an adaptive way. In an embodiment, the fixed and adaptive ANC/ANR filters are real-time weighted using an interactively updated weighting factor to achieve high attenuation performance while maintaining the robustness of the ANC/ANR performance. In an embodiment, the ANC/ANR performance of the adaptive filter is compared to the entire ANC/ANR performance in real-time. In an embodiment, the adaptive filter is used only if its estimated ANC/ANR performance is better than the performance of the whole system. In an embodiment, the weightings for the fixed and adaptive filters are adjusted to output improved anti-noise signals.

More specifically, according to a first aspect, an audio controller for an active noise reduction, ANR, device is disclosed, which is adapted for reducing an ambient noise signal. In an embodiment, the ANR device may be an active noise cancellation, ANC, device adapted for cancelling an ambient noise signal.

The audio controller comprises a processing circuitry configured to provide, i.e. implement at least one fixed ANR filter, wherein the fixed ANR filter comprises a plurality of fixed filter coefficients and is configured to generate a first noise reduction signal. Moreover, the processing circuitry is configured to provide, i.e. implement at least one adaptive ANR filter, wherein the adaptive ANR filter comprises one or more adjustable filter coefficients for adapting the adaptive ANR filter and wherein the adaptive ANR filter is configured to generate a second noise reduction signal. The processing circuitry is further configured to generate a total noise reduction signal as an adjustable weighted linear combination, i.e. sum of the first noise reduction signal and the second noise reduction signal. Thus, an improved audio controller for combining fixed and adaptive ANC/ANR filters in a semi-adaptive ANC/ANR device is provided allowing to achieve an optimal balance between high attenuation performance and the robustness/stability of the ANC/ANR device.

In a further possible implementation form of the first aspect, the processing circuitry is further configured to determine a noise reduction estimate of the reduction of the ambient noise signal caused by the second noise reduction signal, and to determine the adjustable weighted linear combination based on the noise reduction estimate.

In a further possible implementation form of the first aspect, the processing circuitry is configured to generate the total noise reduction signal as the adjustable weighted linear combination, i.e. sum of the first noise reduction signal and the second noise reduction signal based on an adjustable weighting, i.e. gain coefficient a.

In a further possible implementation form of the first aspect, the processing circuitry is configured to generate the total noise reduction signal as the adjustable weighted linear combination, i.e. sum of the first noise reduction signal and the second noise reduction signal based on the following equation:

$$y = a y_{fixed} + (1-a) y_{adap},$$

wherein $y_{fixed}$ denotes the first noise reduction signal provided by the fixed ANR filter, $y_{adap}$ denotes the second noise reduction signal provided by the adaptive ANR filter, and y denotes the total noise reduction signal.

In a further possible implementation form of the first aspect, the processing circuitry is configured to determine the adjustable weighting, i.e. gain coefficient a based on the following equation:

$$a = \begin{cases} \dfrac{MM(e'(n))}{MM(e(n))} & \text{for } MM(e'(n)) \le MM(e(n)) \\ 1 & \text{for } MM(e'(n)) > MM(e(n)) \end{cases}$$

wherein MM(x) denotes a magnitude measure of the argument vector x, n denotes a temporal sample index, e(n) denotes a total residual noise signal and e'(n) denotes a fractional residual noise signal.

In a further possible implementation form of the first aspect, the processing circuitry is configured to determine the adjustable weighting, i.e. gain coefficient a using a root mean square as the magnitude measure MM(x).

In a further possible implementation form of the first aspect, the processing circuitry is configured to estimate a secondary path transfer function G'(z), wherein the secondary path transfer function G'(z) describes the modification of the total residual noise signal e(n) resulting in the fractional residual noise signal e'(n), and wherein the processing circuitry is further configured to determine the fractional residual noise signal e'(n) based on the second noise reduction signal $y_{adap}$, the total residual noise signal e(n) and the secondary path transfer function G'(z).

In a further possible implementation form of the first aspect, the processing circuitry is further configured to continually adjust the adjustable weighted linear combination, i.e. sum of the first noise reduction signal and the second noise reduction signal for generating the total noise reduction signal, wherein initially the total noise reduction signal is equal to the first noise reduction signal provided by the fixed ANR filter.

In a further possible implementation form of the first aspect, the processing circuitry is further configured to adjust the one or more adjustable filter coefficients of the adaptive ANR filter based on a total residual noise signal.

According a second aspect an active noise reduction, ANR, device, in particular an active noise cancellation, ANC, device is provided, wherein the ANR device comprises an audio controller according to the first aspect and a loudspeaker, wherein the loudspeaker is configured to be driven based on the total noise reduction signal generated by the audio controller. The ANR device may be, for instance, a headset device, an earphone device or the like.

In a further possible implementation form of the second aspect, the ANR device comprises a feedforward (FF) microphone configured to detect the ambient noise signal, wherein the fixed ANR filter is configured to generate the first noise reduction signal on the basis of the ambient noise signal, and wherein the adaptive ANR filter is configured to generate the second noise reduction signal on the basis of the ambient noise signal. Thus, the ANR device according to the second aspect may be implemented as a fixed FF ANR device.

In a further possible implementation form of the second aspect, the ANR device comprises a feedback (FB) microphone configured to detect a total residual noise signal, wherein the fixed ANR filter is configured to generate the first noise reduction signal on the basis of the total residual noise signal and wherein the adaptive ANR filter is configured to generate the second noise reduction signal on the basis of the total residual noise signal. Thus, the ANR device according to the second aspect may be implemented as a fixed or adaptive FB ANR device.

In a further possible implementation form of the second aspect, the ANR device comprises a feedforward (FF) microphone configured to detect the ambient noise signal and a feedback (FB) microphone configured to detect a total residual noise signal, wherein the fixed ANR filter is configured to generate the first noise reduction signal on the basis of the ambient noise signal and the total residual noise signal and wherein the adaptive ANR filter is configured to generate the second noise reduction signal on the basis of the ambient noise signal and the total residual noise signal. Thus, the ANR device according to the second aspect may be implemented as a fixed or adaptive hybrid ANR device or an adaptive FF ANR device.

According to a third aspect an active noise reduction, ANR, method for reducing an ambient noise signal is provided. The ANR method comprises the steps of:

generating a first noise reduction signal with a fixed ANR filter;

generating a second noise reduction signal with an adaptive ANR filter, wherein the adaptive ANR filter comprises one or more adjustable filter coefficients for adapting the adaptive ANR filter; and generating a total noise reduction signal as an adjustable weighted linear combination, i.e. sum of the first noise reduction signal and the second noise reduction signal.

The ANR method according to the third aspect of the present disclosure can be performed by the audio controller according to the first aspect or the ANR device according to the second aspect of the present disclosure. Thus, further features of the ANR method according to the third aspect of the present disclosure result directly from the functionality of the audio controller according to the first aspect and the ANR device according to the second aspect of the present disclosure as well as their different implementation forms described above and below.

According to a fourth aspect, a computer program product comprising a non-transitory computer-readable storage medium for storing program code which causes a computer or a processor to perform the ANR method according to the third aspect, when the program code is executed by the computer or the processor, is provided.

Details of one or more embodiments are set forth in the accompanying drawings and the description below. Other features, objects, and advantages will be apparent from the description, drawings, and claims.

BRIEF DESCRIPTION OF THE DRAWINGS

In the following, embodiments of the present disclosure are described in more detail with reference to the attached figures and drawings, in which.

In the following, identical reference signs refer to identical or at least functionally equivalent features.

DETAILED DESCRIPTION

In the following description, reference is made to the accompanying figures, which form part of the disclosure, and which show, by way of illustration, specific aspects of embodiments of the present disclosure or specific aspects in which embodiments of the present disclosure may be used. It is understood that embodiments of the present disclosure may be used in other aspects and comprise structural or logical changes not depicted in the figures. The following detailed description, therefore, is not to be taken in a limiting sense, and the scope of the present disclosure is defined by the appended claims.

For instance, it is to be understood that a disclosure in connection with a described method may also hold true for a corresponding device or system configured to perform the method and vice versa. For example, if one or a plurality of specific method steps are described, a corresponding device may include one or a plurality of units, e.g. functional units, to perform the described one or plurality of method steps (e.g. one unit performing the one or plurality of steps, or a plurality of units each performing one or more of the plurality of steps), even if such one or more units are not explicitly described or illustrated in the figures. On the other hand, for example, if a specific apparatus is described based on one or a plurality of units, e.g. functional units, a corresponding method may include one step to perform the functionality of the one or plurality of units (e.g. one step performing the functionality of the one or plurality of units, or a plurality of steps each performing the functionality of one or more of the plurality of units), even if such one or plurality of steps are not explicitly described or illustrated in the figures. Further, it is understood that the features of the various exemplary embodiments and/or aspects described herein may be combined with each other, unless specifically noted otherwise.

Figure 1:
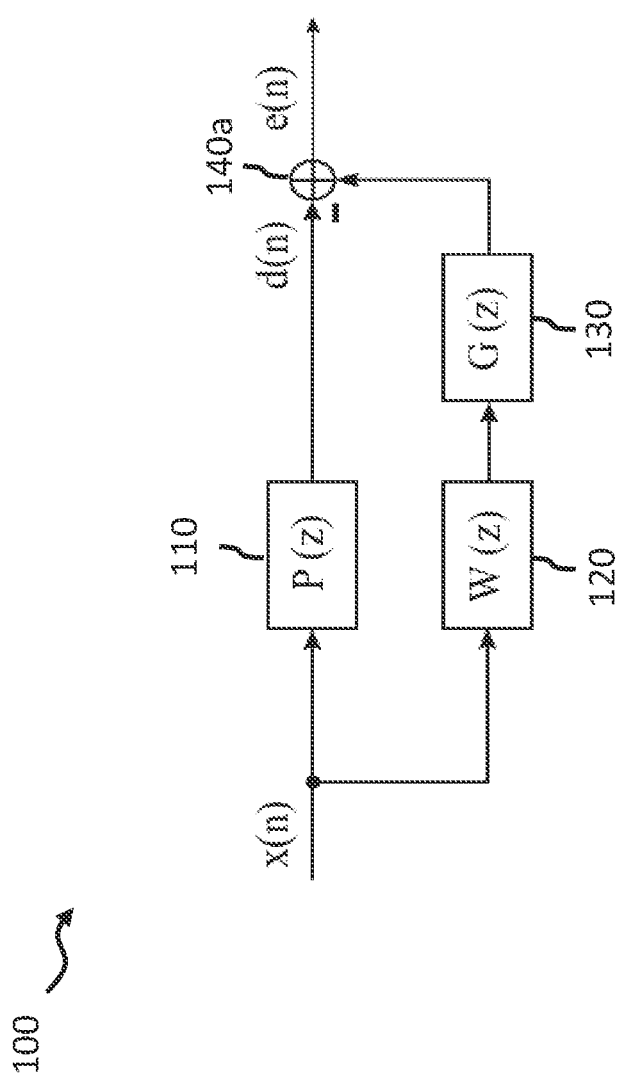
FIG. 1 is a schematic diagram illustrating a signal processing architecture including an audio controller for a fixed FF ANR/ANC device.

Before describing different embodiments in detail, in the following some terminology as well as technical background concerning active noise reduction/cancellation (ANR/ANC) will be introduced. FIG. 1 is a schematic diagram illustrating a signal processing architecture 100 including an audio controller for a fixed FF ANR/ANC device, i.e. an ANR/ANC device with a fixed FF filter. In the case of a fixed FF ANR/ANC, the noise signal is recorded by an external microphone (reference microphone), passed through the audio controller to generate noise canceling signals, and the computed anti-noise signal is played back via a loudspeaker. In FIG. 1, P(z) 110 denotes the primary path, which represents the acoustic transfer function between the external (reference) and internal (error) microphones. G(z) 130 denotes the secondary path, consisting of the transfer function between the speaker and the internal (error) microphone. W(z) 120 denotes the FF controller 120 configured to create the acoustic canceling signal. The purpose is to suppress the internal noise signal d(n), i.e., the external noise signal x(n) which has been modified by the acoustic transfer function of the primary path 110, for instance, transmitted and attenuated by the headphone housing. The combination 140a of the internal noise signal d(n) and the acoustic canceling signal (modified by the acoustic transfer function of the secondary path 130) results in a residual noise signal or error signal e(n). Generally, a causal approximation of the FF controller 120 may be obtained by solving the Wiener-Hopf equation:

$$W_{opt} = \Psi_{gg}^{-1} \phi_{pg}$$

where $\Psi_{gg}$ describes the auto-correlation matrix for the impulse response of G(z) 130, and $\phi_{pg}$ represents the cross-correlation vector between the impulse responses of P(z) 110 and G(z) 130.

Figure 2:
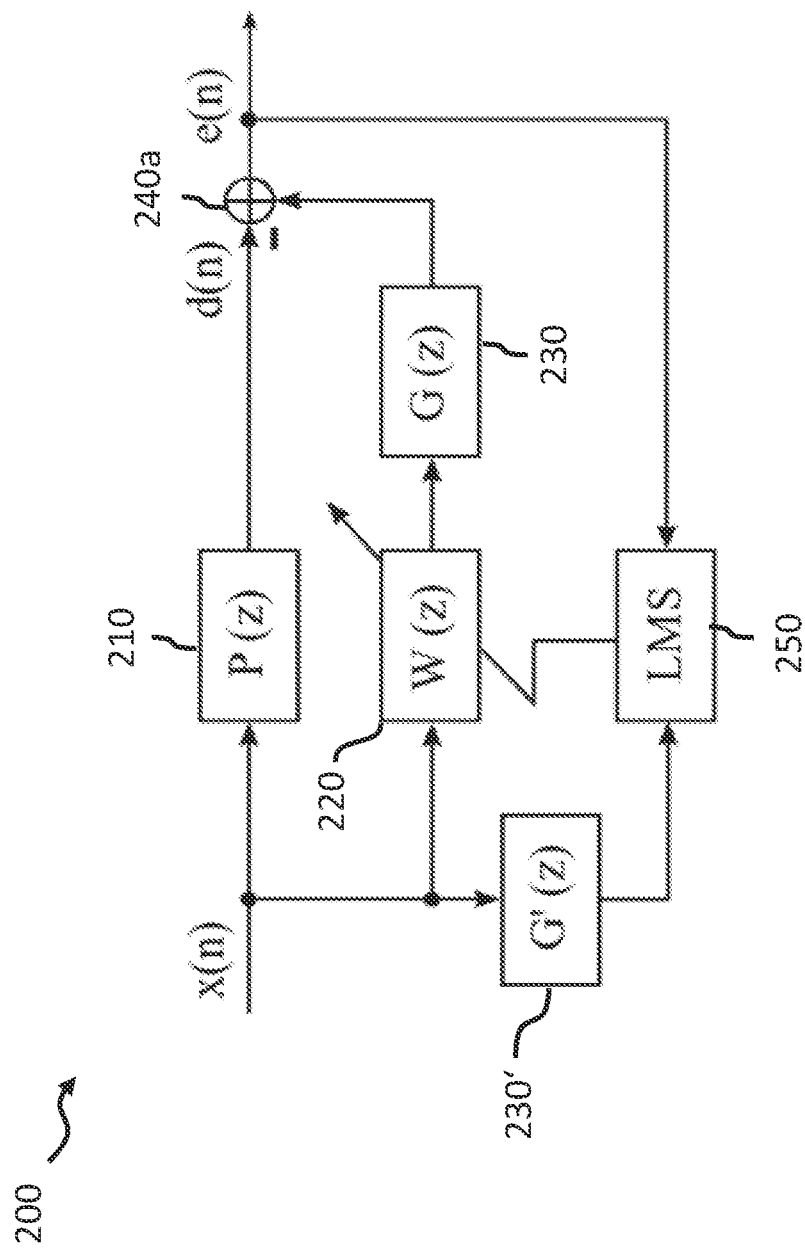
FIG. 2 is a schematic diagram illustrating a signal processing architecture including an audio controller for an adaptive FF ANR/ANC device.

FIG. 2 is a schematic diagram illustrating a signal processing architecture 200 including an audio controller for an adaptive FF ANR/ANC device, i.e. an ANR/ANC device with an adaptive FF filter based, by way of example, on the filtered-x least mean square (FxLMS) algorithm. The audio controller 220 is updated in real-time based on the recorded noise signal x(n) and the error signal e(n). The recorded noise signal is first filtered through an estimated secondary path, G'(z) 230, which is an approximation of the acoustic transfer path between the headphone speaker and the inner microphone (i.e. the secondary path G(z) 230). After that, the filtered input signal and the error signal are fed into a LMS processing block 250 for determining the transfer function of the audio controller W(z) 220. The recorded input signal is filtered through the estimated controller and reproduced over the speaker. The combination 240a of the internal noise signal d(n) (resulting from the modification of the noise signal x(n) by the acoustic transfer function of the primary path 210) and the acoustic canceling signal (modified by the acoustic transfer function of the secondary path 230) results in a residual noise signal or error signal e(n). The FxLMS algorithm implemented by the LMS processing block 250 can be expressed as:

$$e(n)=d(n)-g^T(n)[w^T(n)x(n)]$$

$$w(n+1)=w(n)-\mu[g'^T(n)x(n)]e(n)$$

where n denotes the time index, g(n) and g'(n) are the real and measured impulse responses of the secondary path, respectively, $w(n)=[w_0(n), w_1, (n), \ldots, w_{L-1}(n)]$ is the coefficient of the controller W(z) 220 with a filter order of L, and $x(n)=[x(n), x(n-1), x(n-2), \ldots x(n-L+1)]$ is the recorded signal vector consisting of the last L samples. Instead of an FxLMS algorithm the LMS processing block 250 may implemented other adaptive algorithms based on the FxLMS algorithm, such as leaky FxLMS, FxNLMS, band limited FxLMS, Kalman-filter based adaptive algorithms and the like.

Figure 3:
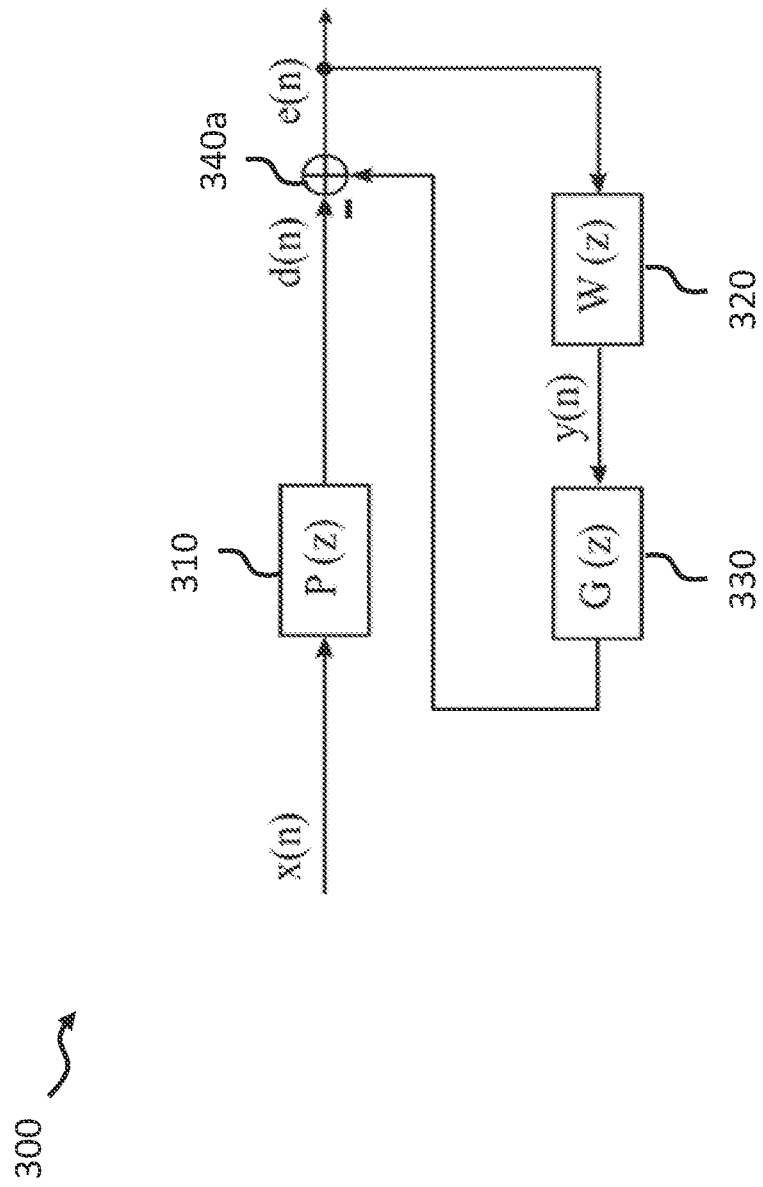
FIG. 3 is a schematic diagram illustrating a signal processing architecture including an audio controller for a fixed FF ANR/ANC device.

FIG. 3 is a schematic diagram illustrating a signal processing architecture 300 including an audio controller for a fixed FB ANR/ANC device, i.e. an ANR/ANC device with a fixed FB filter. In a FB ANR/ANC device, the error signal, e(n), is used to synthesize the reference signal and further to create the anti-noise signal. In comparison with an FF ANC device, the external microphone is no more needed to obtain the reference noise signal. In the signal processing architecture 300 shown in FIG. 3 the FB controller W(z) 320 is designed based on the secondary path G(z) 330. The combination 340*a* of the internal noise signal d(n) (resulting from the modification of the noise signal x(n) by the acoustic transfer function of the primary path 310) and the acoustic canceling signal y(n) (modified by the acoustic transfer function of the secondary path 330) results in the residual noise signal or error signal e(n). The transfer function/ sensitivity function, S(z), between the desired signal d(n) and the error signal e(n) is minimized to achieve a high attenuation performance. On the other hand, the complementary sensitivity function, T(z)=1−S(z), represents the robustness of the whole system and should be small in comparison to the measurement noise. Since it is generally not possible to achieve these two criteria at the same time, a trade-off between the performance and the robustness is usually made. For that, the mixed-sensitivity H-Inf synthesis method may be used to optimize the fixed controller 320 considering these two criteria (as described, for instance, in Skogestad, S. and Postlethwaite, I. (2007), "Multivariable feedback control: analysis and design", Volume 2, Wiley New York).

Figure 4:
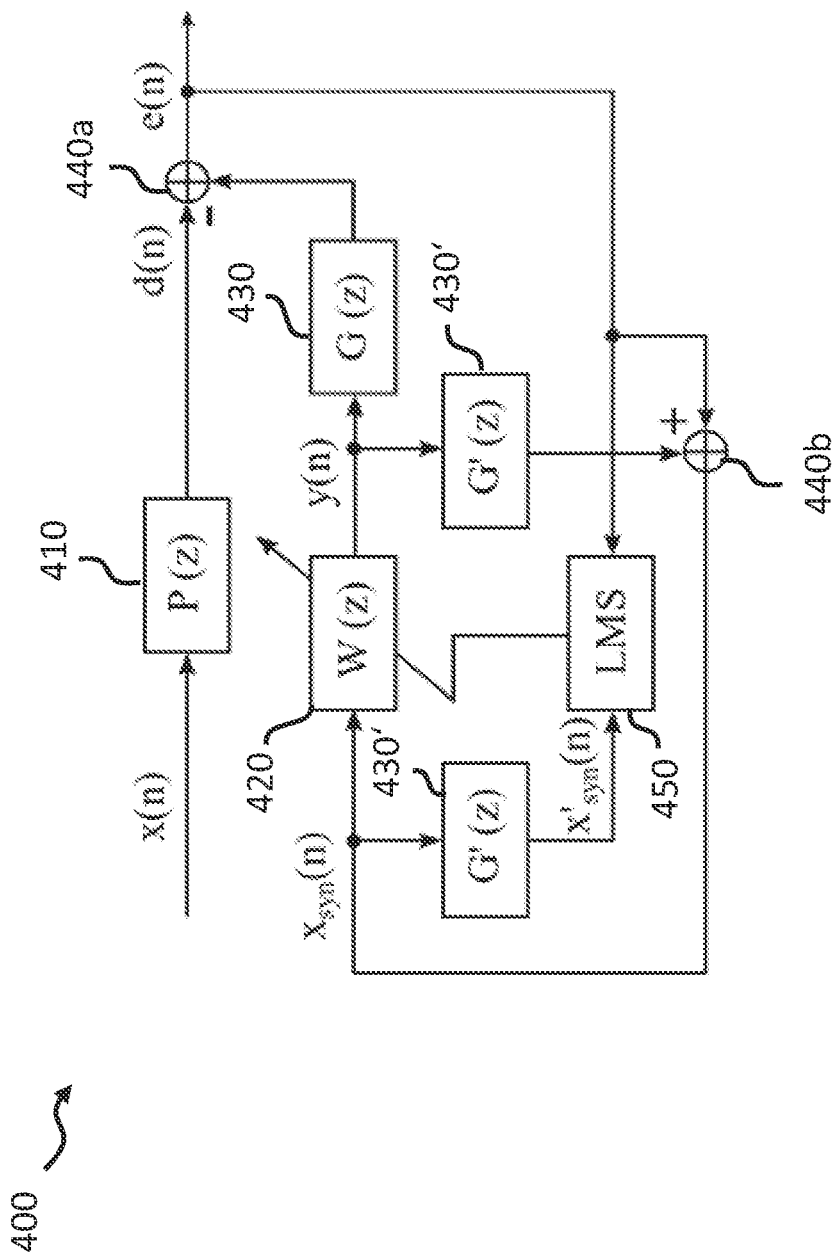
FIG. 4 is a schematic diagram illustrating a signal processing architecture including an audio controller for an adaptive FB ANR/ANC device.

FIG. 4 is a schematic diagram illustrating a signal processing architecture 400 including an audio controller for an adaptive FB ANR/ANC device, i.e. an ANR/ANC device with an adaptive FB filter based, by way of example, on the filtered-x least mean square (FxLMS) algorithm. The basic idea of an adaptive FB ANR/ANC device is to predict the reference signal for the audio controller 420. The synthesized reference signal, $x_{syn}$ can be calculated as:

$$x_{syn}=e(n)+[g'^T(n)y(n)]$$

Under ideal conditions, i.e., g'(n)=g(n), an adaptive FB ANR/ANC device is equivalent to an adaptive FF ANR/ ANC device. FxLMS based adaptive filtering algorithms may be used for obtaining the FB audio controller 420 as described above in the context of FIG. 2 for the adaptive FF ANR/ANC device.

In the following several embodiments of the present disclosure will be described in more detail under reference to FIGS. 5, 6, 7 and 8. As will be appreciated from the following, embodiments disclosed herein combine a fixed ANR/ANC filter and an adaptive ANR/ANC filter using an adjustable weighting factor for generating improved anti-noise signals. This allows increasing the ANR/ANC performance, while maintaining the robustness and stability of the semi-adaptive ANR/ANC device. As will be described in more below, this approach may be implemented in FF, FB and even hybrid ANR/ANC devices.

Figure 5:
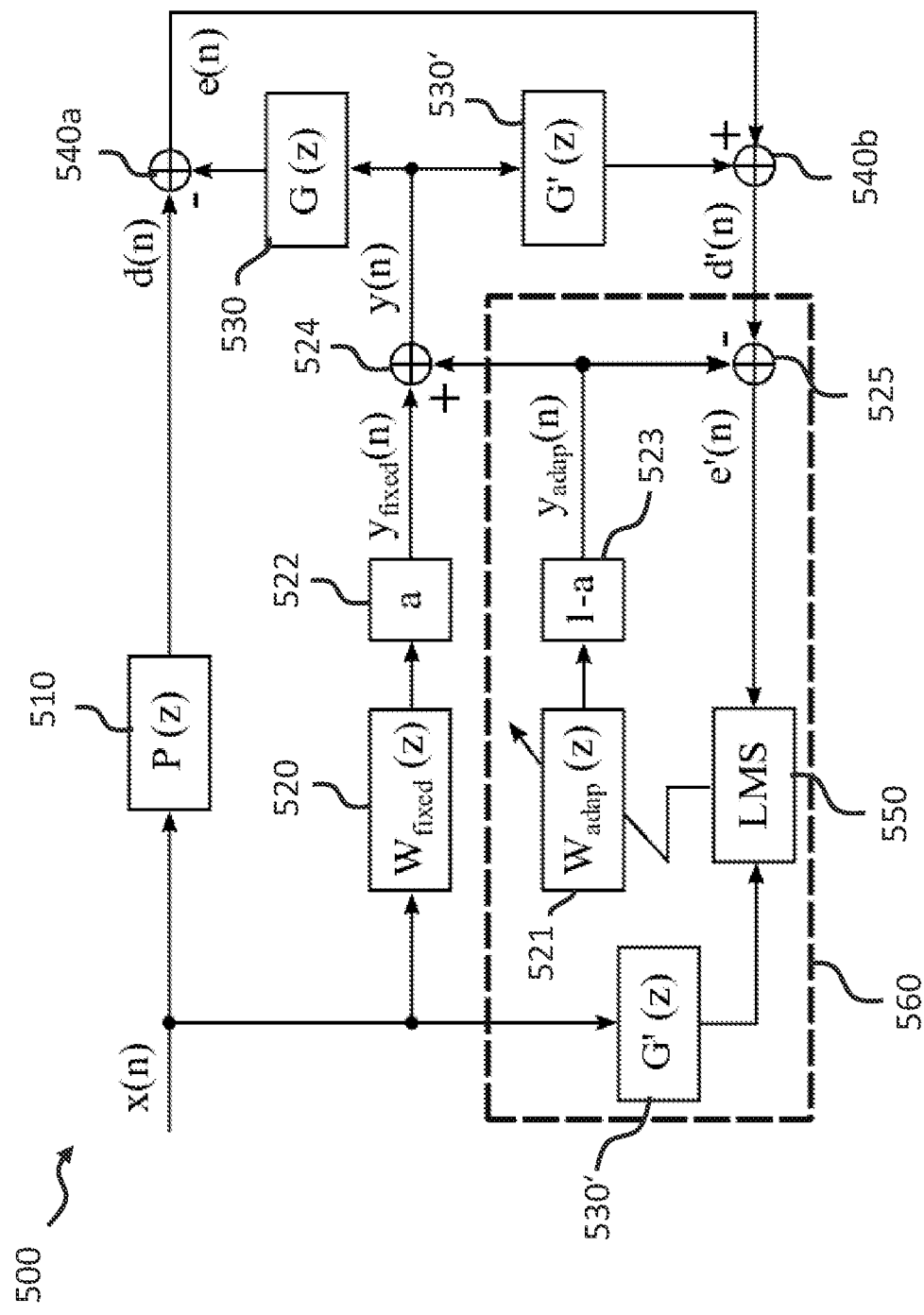
FIG. 5 is a schematic diagram illustrating a signal processing architecture including an audio controller for a semi-adaptive FF ANR/ANC device according to an embodiment.

FIG. 5 is a schematic diagram illustrating a signal processing architecture 500 including an audio controller for a semi-adaptive FF ANR/ANC device according to an embodiment. In the embodiment of FIG. 5, the audio controller comprises a processing circuitry configured to provide, i.e. implement a fixed ANR/ANC filter ($W_{fixed}(z)$) 520, wherein the fixed ANR/ANC filter 520 comprises a plurality of fixed filter coefficients and is configured to generate a first noise reduction signal $y_{fixed}(n)$ as an output signal. Moreover, the processing circuitry of the audio controller is configured to provide, i.e. implement an adaptive ANR/ ANC filter ($W_{adap}(z)$) 521, wherein the adaptive ANR/ANC filter 521 comprises one or more adjustable filter coefficients for adapting the adaptive ANR/ANC filter 521 and wherein the adaptive ANR/ANC filter 521 is configured to generate a second noise reduction signal $y_{adap}(n)$ as an output signal. The processing circuitry of the audio controller is further configured to generate a total noise reduction signal y(n) as an adjustable weighted linear combination, i.e. sum of the first noise reduction signal $y_{fixed}(n)$ and the second noise reduction signal $y_{adap}(n)$. In an embodiment, the processing circuitry is configured to generate the total noise reduction signal y(n) based on an adjustable weighting factor a using the following equation (as implemented by the processing block 524 shown in FIG. 5):

$$y(n)=ay_{fixed}(n)+(1-a)y_{adap}(n).$$

As illustrated in FIG. 5, the audio controller may implement weighting blocks 522 and 523 for weighting the output signal $y_{fixed}(n)$ of the fixed ANR/ANC filter 520 with the factor a and weighting the output signal $y_{adap}(n)$ of the adaptive ANR/ANC filter 521 with the factor (1−a).

In the embodiment shown in FIG. 5, the combination 540*a* of the internal noise signal d(n) (resulting from the modification of the noise signal x(n) by the acoustic transfer function P(z) of the primary path 510) and the total noise reduction signal, i.e. the acoustic cancelling signal y(n) (modified by the acoustic transfer function G(z) of the secondary path 230) results in a residual noise signal or error signal e(n). The recorded error signal e(n) is used to estimate, i.e. simulate the desired error signal (d'(n)) with the total noise reduction signal y(n) and the averaged (simulated) secondary path (G'(z)). In the embodiment shown in FIG. 5, the output signal of the adaptive filter 521, i.e. the second noise reduction signal $y_{adap}(n)$ is calculated by applying the FxLMS algorithm (implemented by the LMS processing block 550) based on simulated desired error signal (d'(n)), the simulated secondary path (G'(z)), and the input signal (x(n)). The simulated residual error signal (e'(n)) is obtained based on $y_{adap}(n)$, d'(n), and G'(z).

In the embodiment shown in FIG. 5, the weighting factor a may be determined based on the RMS of the simulated error signal and the real measured one to adjust the weighting of the output of the fixed filter 520 and the adaptive filter 521. In an embodiment, the processing circuitry may be configured to determine the adjustable weighting coefficient a based on the following equation:

$$a = \begin{cases} \dfrac{\text{RMS}(e'(n))}{\text{RMS}(e(n))} & \text{for RMS}(e'(n)) \le \text{RMS}(e(n)) \\ 1 & \text{for RMS}(e'(n)) > \text{RMS}(e(n)) \end{cases}$$

wherein RMS(x) denotes the root mean square measure of the argument vector x, n denotes a temporal sample index, e(n) denotes the total residual noise signal and e'(n) denotes the fractional residual noise signal. As will be appreciated, instead of the root mean square measure RMS(x) other magnitude measures may be used as well.

As will be appreciated, based on the equation described above the weighting factor a will be adjusted, in particular reduced by the processing circuitry only if the ANR/ANC performance of the adaptive filter 521 is larger than the current overall ANR/ANC performance. If the performance of the adaptive filter 521 is worse than the overall ANR/ANC performance (i.e. the current combination of the fixed and adaptive ANC filter), the weighting factor a is reset to an initial value of 1 to ensure the stability/robustness of the ANR/ANC device. Thus, in an embodiment, the processing circuitry is configured to continually adjust the adjustable weighted linear combination of the first noise reduction signal $y_{fixed}(n)$ and the second noise reduction signal $y_{adap}(n)$ for generating the total noise reduction signal $y(n)$, wherein initially the total noise reduction signal $y(n)$ is equal to the first noise reduction signal $y_{fixed}(n)$.

Figure 6:
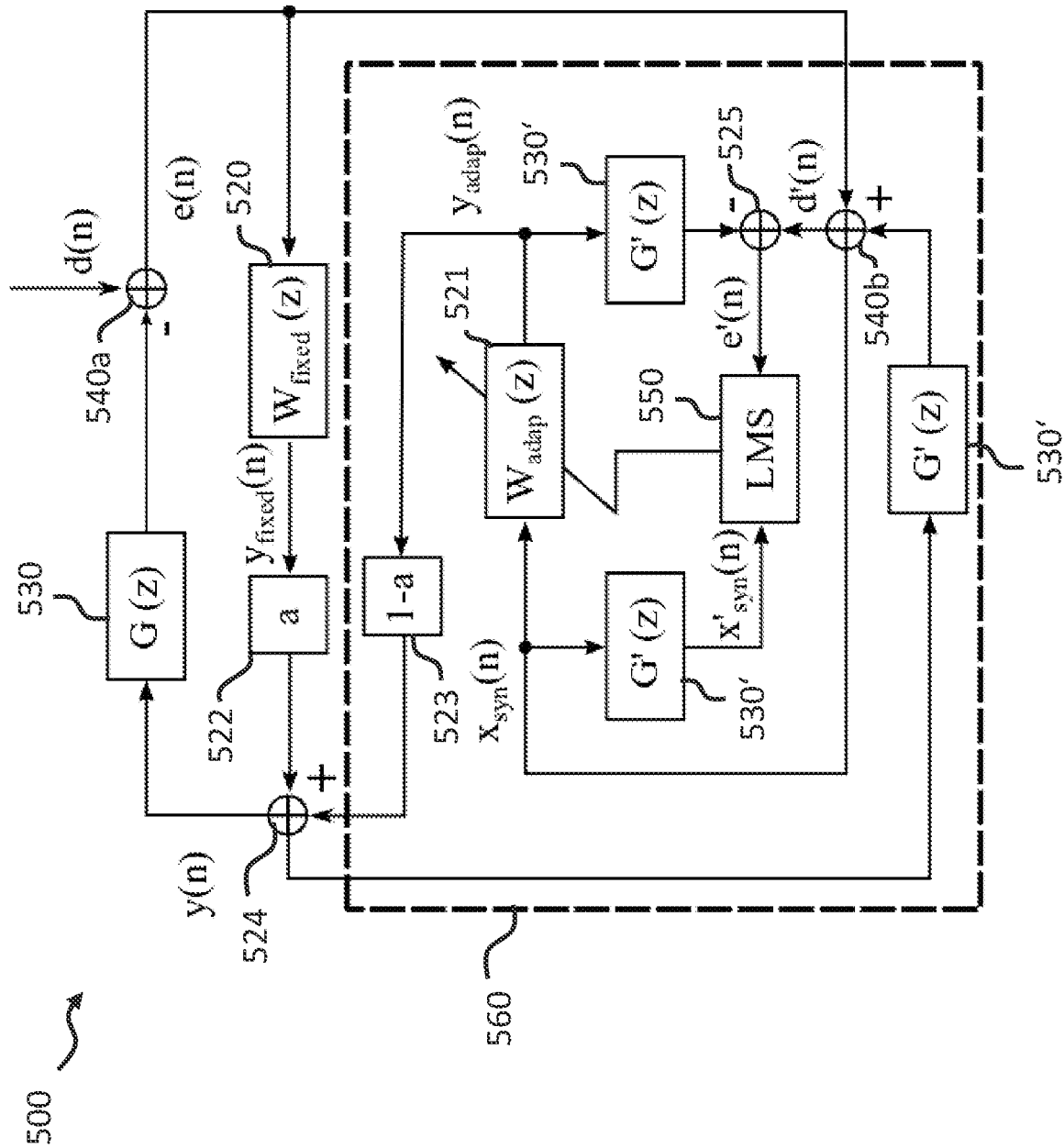
FIG. 6 is a schematic diagram illustrating a signal processing architecture including an audio controller for a semi-adaptive FB ANR/ANC device according to an embodiment.

FIG. 6 shows a variant of the signal processing architecture 500 of FIG. 5 for a semi-adaptive FB ANR/ANC device according to an embodiment. As can be taken from FIG. 6, the recorded error signal e(n) is used to simulate the desired error signal (d'(n)) and the reference signal ($x_{syn}(n)$=d'(n)) with the output signal, i.e. the total noise reduction signal $y(n)=ay_{fixed}(n)+(1-a)y_{adap}(n)$ and the averaged or simulated secondary path (G'(z) 530'). The output signal $y_{adap}(n)$ is calculated by applying, by way of example, the FxLMS algorithm based on the simulated desired error signal (d'(n)), the simulated secondary path (G'(z) 530'), and the synthesized input signal ($x_{syn}(n)$). The simulated residual error signal (e'(n)) is obtained based on $y_{adap}(n)$, d'(n), and G'(z). The weighting factor a may be determined by the processing circuitry in the same way as already described above for the FF ANR/ANC embodiment of FIG. 5.

Figure 7:
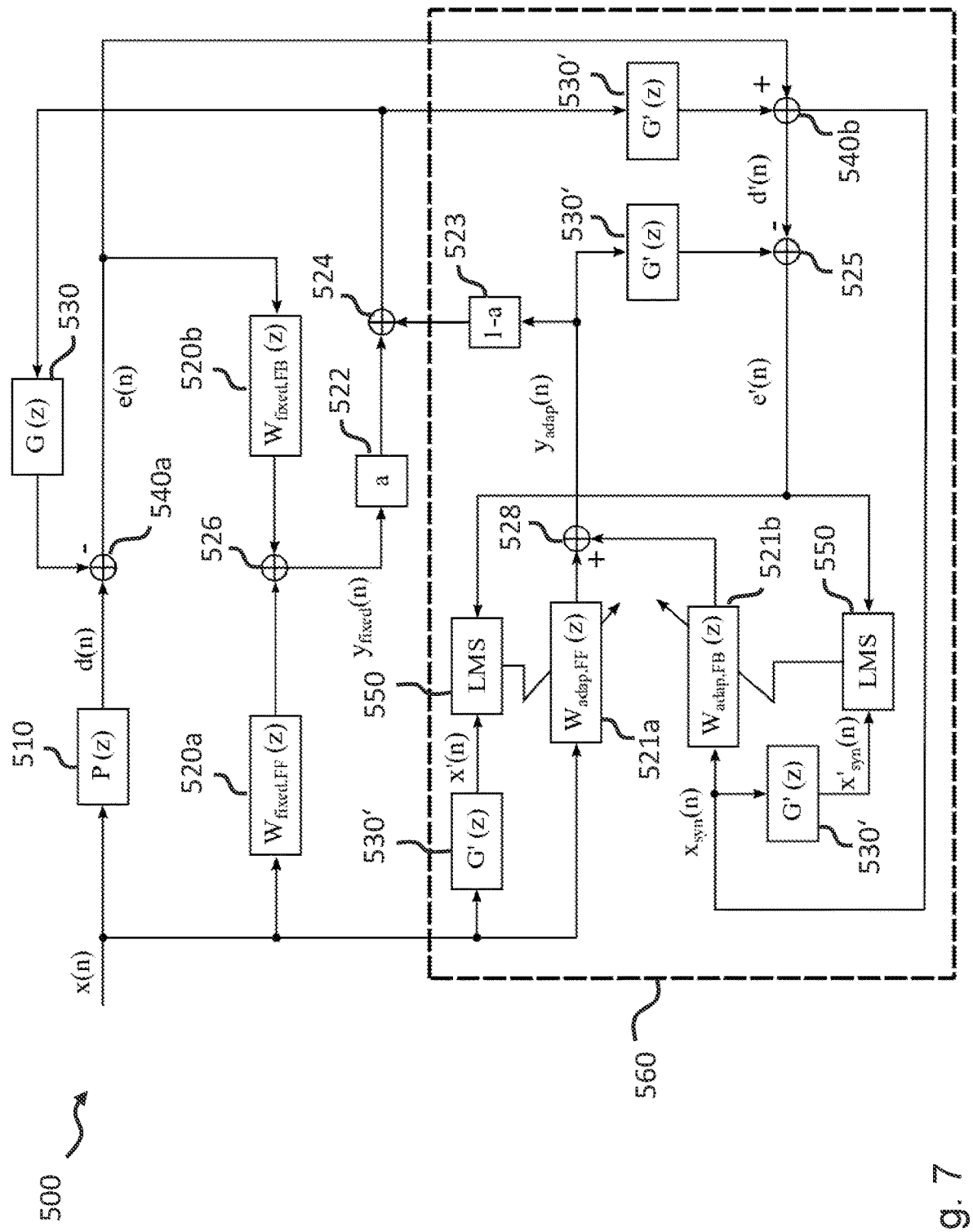
FIG. 7 is a schematic diagram illustrating a signal processing architecture including an audio controller for a semi-adaptive hybrid ANR/ANC device according to an embodiment.

FIG. 7 shows a further variant of the signal processing architecture 500 of FIGS. 5 and 6 for a semi-adaptive hybrid ANR/ANC device according to an embodiment. As can be taken from FIG. 7, in this embodiment the signal processing architecture 500 comprises a fixed FF filter ($W_{fixed,FF}(z)$ 520*a*), a fixed FB filter ($W_{fixed,FB}(z)$ 520*b*), an adaptive FF filter ($W_{adap,FF}(z)$ 521*a*), and an adaptive FB filter ($W_{adap,FB}(z)$ 521*b*). In this embodiment, the output signals of the two fixed filters 520*a* and 520*b* (fixed FF and FB) are summed up by the processing block 526 and weighted by the processing block 522 using the adapted weighing factor a. The output signals of two adaptive filters 521*a*, 521*b* based, by way of example, on the FxLMS algorithm implemented by the processing blocks 550 are also summed up by the processing block 528 and weighted by the processing block 523 with the factor 1−a. The recorded error signal e(n) is used to simulate the desired error signal (d'(n)) and the reference signal ($x_{syn}(n)$=d'(n), only for the FB filters) with the output signal ($y(n)=a\ y_{fixed}(n)+(1-a)\ y_{adap}(n)$) and the averaged secondary path (G'(z) 530). The output signals of the FF and FB adaptive filters 521*a*, 521*b* are calculated by the processing circuitry based on the simulated desired error signal (d'(n)), the simulated secondary path (G'(z) 530'), and the synthesized ($x_{syn}(n)$, for the FB filter 521*b*) or recorded input signal (x(n), for the FF filter 521*a*). The simulated residual error signal (e'(n)) is obtained based on $y_{adap}(n)$, d'(n), and G'(z). The weighting factor a may be determined by the processing circuitry in the same way as already described above for the FF ANR/ANC embodiment of FIG. 5.

In an embodiment, the processing circuitry of the audio controller may be configured to iteratively adjust the weighting factor a using the following processing stages:

(1) At the beginning, a is set to 1 to ensure the robustness/stability of the ANR/ANC processing.

(2) The recorded error signal e(n) is used to simulate the desired error signal (d'(n)) with the output signal, i.e. the total noise reduction signal y(n) and the averaged (simulated) secondary path (G'(z) 530').

(3) The output signal is calculated by applying an adaptive filtering approach based on the simulated desired error signal (d'(n)), the simulated secondary path (G'(z) 530'), and the input signal (x(n), used for FF ANR/ANC).

(4) The simulated residual error signal (e'(n)) is therefore obtained based on the output of the adaptive filter 521, 521*a*, 521*b*, d'(n), and G'(z) 530.

(5) The root mean square error (RMS) of the simulated error signal (RMS (e'(n))) is calculated and compared with that of the real measured one (RMS (e(n))).

(6) The weighting factor a is calculated to adjust the weighting of the fixed filter(s) 520, 520*a*, 520*b* and the adaptive filter(s) 521, 521*a*, 521 *b*.

In an embodiment, the signal processing architecture 500 illustrated in FIGS. 5, 6 and 7 may be implemented by an ANR/ANC device, such as headphones, which further includes a loudspeaker configured to be driven based on the total noise reduction signal $y(n)=a\ y_{fixed}(n)+(1-a)\ y_{adap}(n)$ generated by the signal processing architecture 500.

In an embodiment, the ANR device may be a fixed FF ANR device comprising a feedforward microphone configured to detect the ambient noise signal, wherein the fixed ANR filter 520 is configured to generate the first noise reduction signal $y_{fixed}(n)$ on the basis of the ambient noise signal x(n), and wherein the adaptive ANR filter 521 is configured to generate the second noise reduction signal $y_{adap}(n)$ on the basis of the ambient noise signal x(n).

In an embodiment, the ANR device may be a fixed or adaptive FB ANR device comprising a feedback microphone configured to detect a total residual noise signal, wherein the fixed ANR filter 520 is configured to generate the first noise reduction signal $y_{fixed}(n)$ on the basis of the total residual noise signal and wherein the adaptive ANR filter 521 is configured to generate the second noise reduction signal $y_{adap}(n)$ on the basis of the total residual noise signal.

In an embodiment, the ANR device may be a fixed or adaptive hybrid ANR device or an adaptive FF ANR device comprising a feedforward microphone configured to detect the ambient noise signal and a feedback microphone configured to detect a total residual noise signal, wherein the fixed ANR filter 520; 520*a*, 520*b* is configured to generate the first noise reduction signal $y_{fixed}(n)$ on the basis of the ambient noise signal and the total residual noise signal and wherein the adaptive ANR filter 521; 521*a*, 521*b* is configured to generate the second noise reduction signal $y_{adap}(n)$ on the basis of the ambient noise signal and the total residual noise signal.

Figure 8:
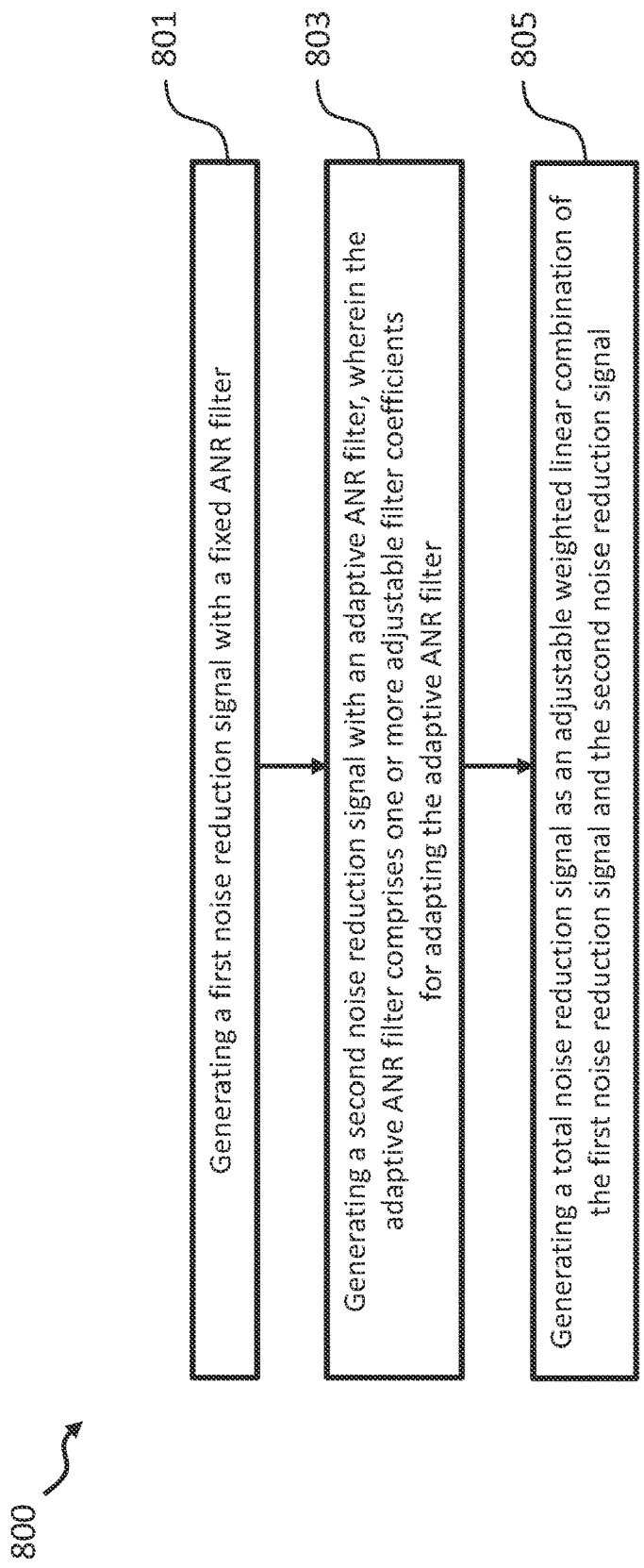
FIG. 8 is a flow diagram illustrating an ANR/ANC method according to an embodiment.

FIG. 8 is a flow diagram illustrating an ANR/ANC method 800 according to an embodiment for reducing an ambient noise signal. The method 800 comprises a first step

801 of generating the first noise reduction signal $y_{fixed}(n)$ with the fixed ANR filter(s) 520, 520a, 520b. Moreover, the method 800 comprises a further step 803 of generating the second noise reduction signal $y_{adap}(n)$ with the adaptive ANR filter(s) 521, 521a, 521b, wherein the adaptive ANR filter(s) 521, 521a, 521b comprise(s) one or more adjustable filter coefficients for adapting the adaptive ANR filter(s) 521, 521a, 521b. The method 800 comprises a further step 805 of generating the total noise reduction signal y(n) as an adjustable weighted linear combination 522, 523, 524 of the first noise reduction signal $y_{fixed}(n)$ and the second noise reduction signal $y_{adap}(n)$, such as based on the equation:

$$y(n) = a y_{fixed}(n) + (1-a) y_{adap}(n).$$

Figure 9:
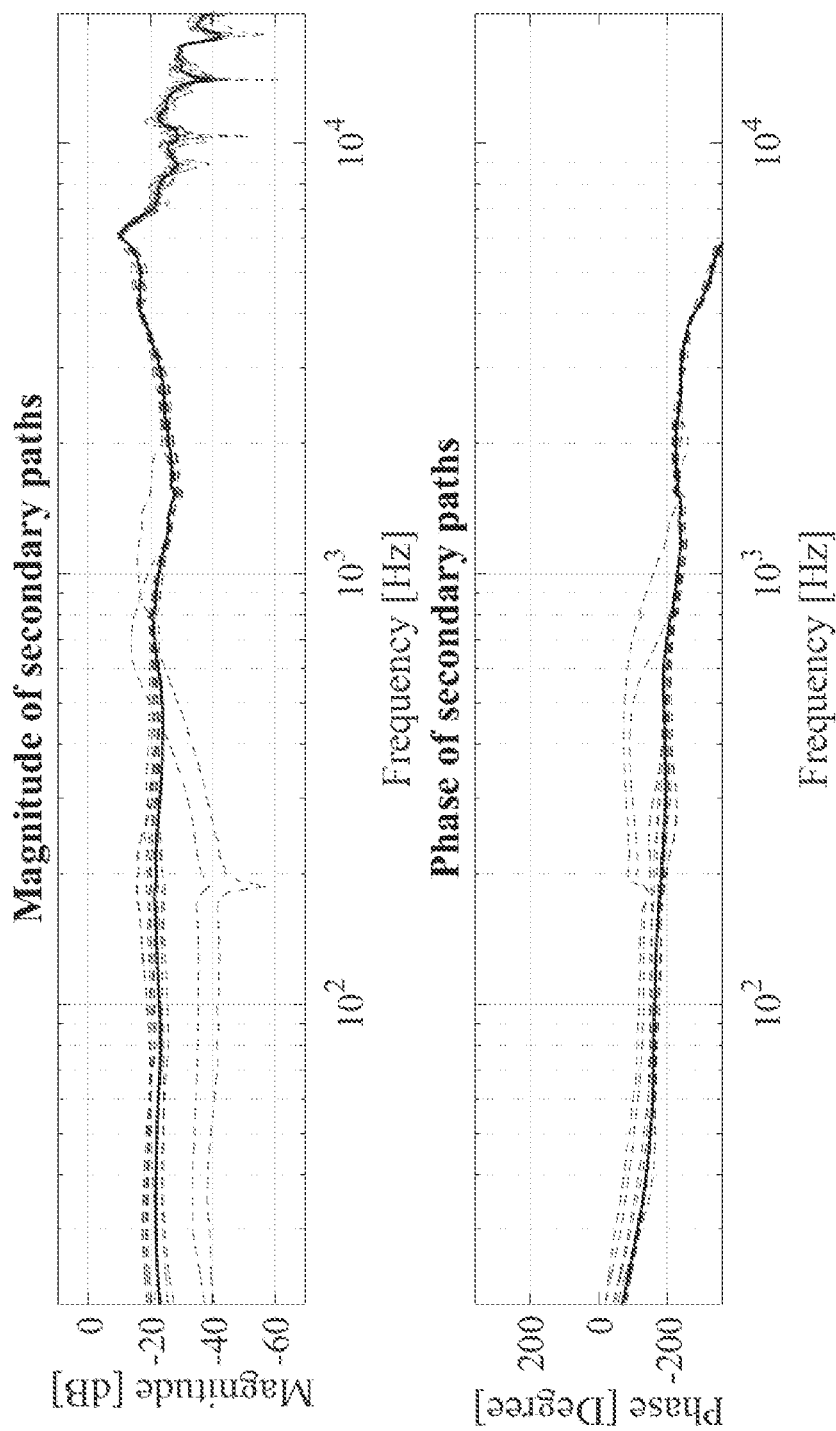
FIG. 9 shows the magnitude and phase of the secondary path transfer function as a function of frequency for different embodiments.
Figure 10A:
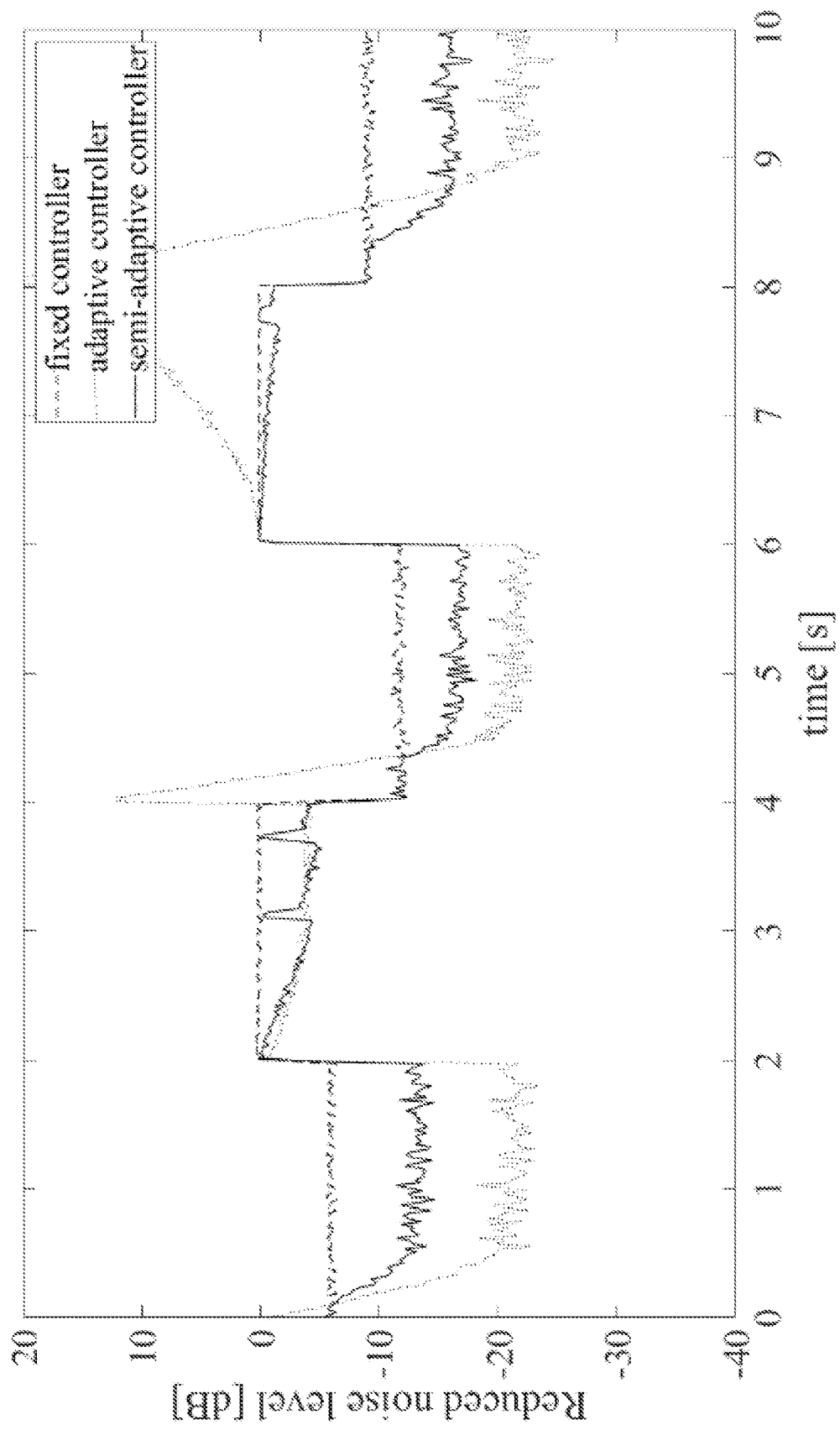
FIG. 10a shows graphs illustrating the performance of a semi-adaptive FF ANR/ANC device according to an embodiment.
Figure 10B:
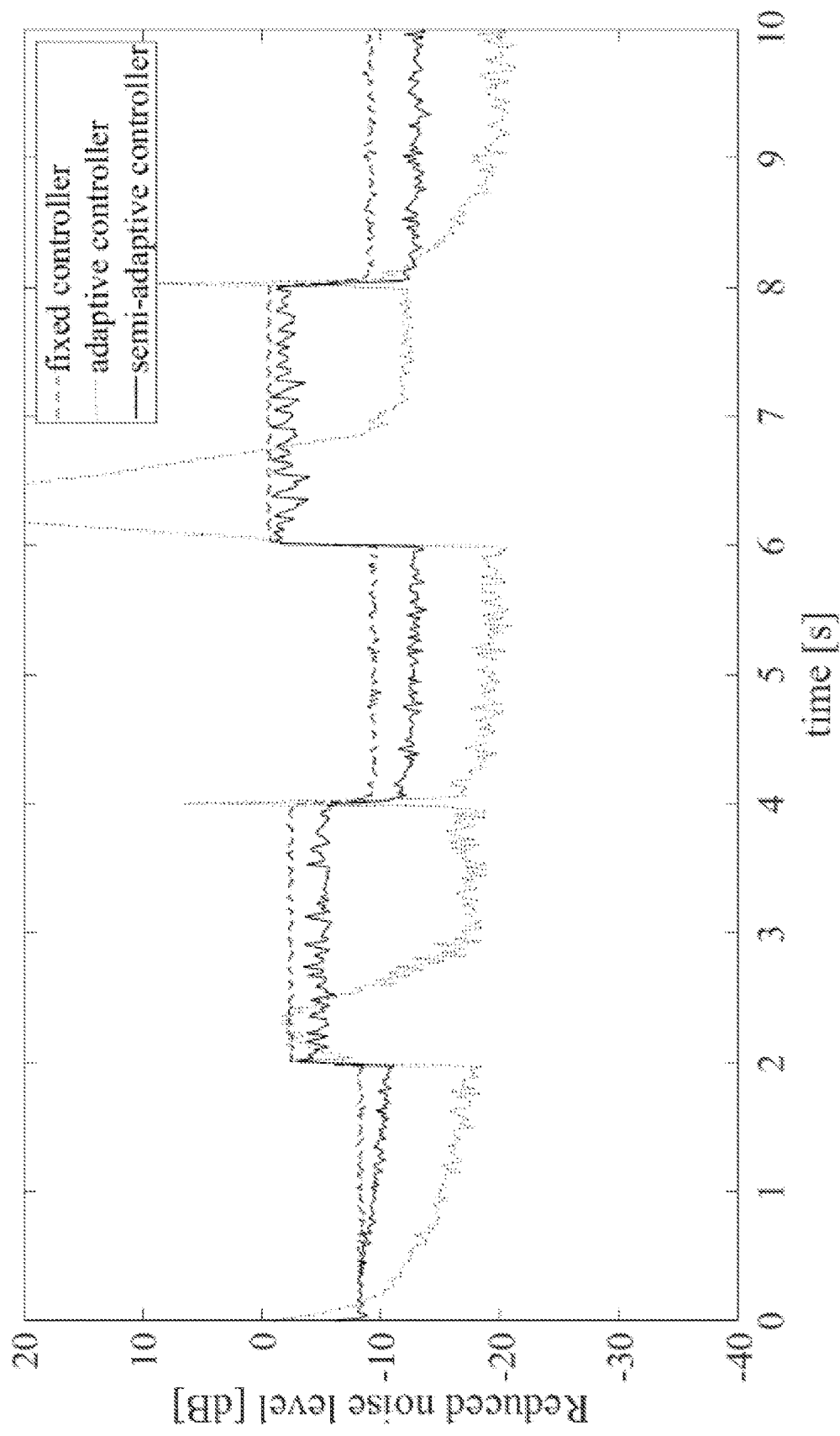
FIG. 10b shows graphs illustrating the performance of a semi-adaptive FB ANR/ANC device according to an embodiment.
Figure 10C:
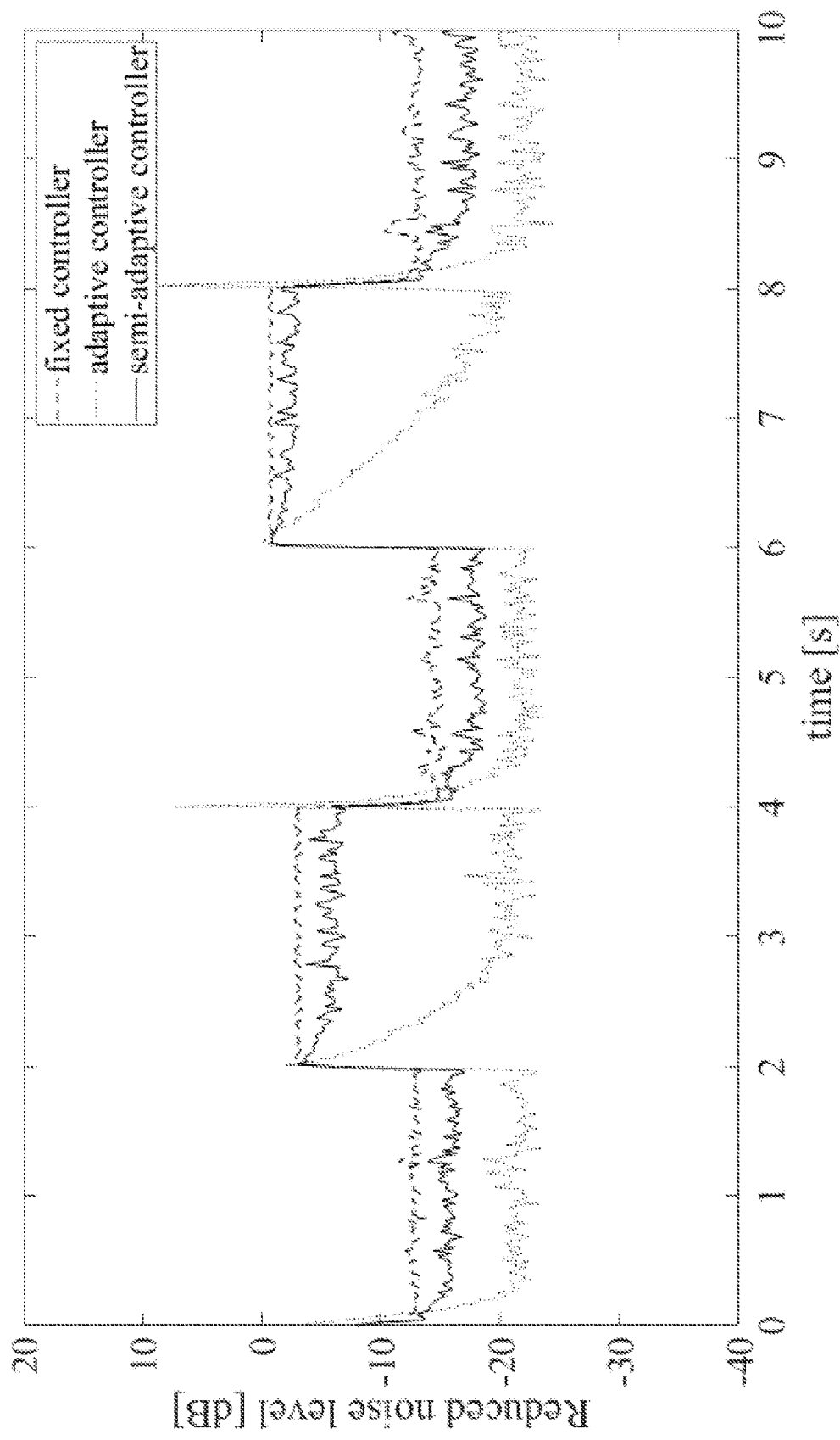
FIG. 10c shows graphs illustrating the performance of a semi-adaptive hybrid ANR/ANC device according to an embodiment.

For testing the improved ANR/ANC performance of embodiments disclosed herein the following exemplary scenario has been chosen. The environmental noise (x(n)) is a 10 s-long mixed signal consisting of a broadband white noise and sinusoidal signals of 100 Hz, 500 Hz and 900 Hz. The primary path (P (z)) is measured for a relative angle between the headphone and the sound source of 90°. Ten different secondary paths (G (z)) are measured with different fitting positions (seats) on a dummy head KU-100 including two special cases, i.e., half on the ear and on the table. FIG. 9 shows the magnitude and phase response of the measure secondary path transfer function G(z) (dashed lines) as a function of frequency. The results differ because of the various headphone fitting positions. The respective solid line represents the mean value of the measurement results, and may be further used to design the FF and FB filters. As already described above, embodiments disclosed herein allow providing the high performance of an adaptive ANC system, while maintaining the robustness/stability of a fixed ANC system in dynamic scenarios. In the simulation experiments shown in FIG. 9, the dynamic scenarios are considered as different headphone seats, i.e., time-varying secondary paths: G(z) changes every 2 s during the 10 s-long simulation. The overall time-varying attenuated noise level is calculated based on the RMS value of residual (e(n)) and desired (d (n)) errors:

FIGS. 10a, 10b and 10c shows graphs illustrating the reduced noise levels achieved by embodiments of a semi-adaptive FF ANR/ANC device, a semi-adaptive FB ANR/ANC device according to an embodiment and a semi-adaptive hybrid ANR/ANC device. For each device, the results are calculated for fixed (dashed line), adaptive (dotted line) and semi-adaptive (solid line) filters. G1-G5 denote five different secondary paths, where G1, G3 and G5 are measured with normal fitting conditions (headphones are put on the head), and G2 and G4 are measured when headphones are on the table or half on the ear (special cases). It can be seen that the fixed ANR/ANC device provides stable attenuation performances with different secondary paths. In addition, there is no large estimation error when changing the secondary paths. In contrast, the adaptive ANR/ANC device shows better ANR/ANC performance than the fixed ANR/ANC device after the required adaption time, but large estimation errors caused by sudden changes of the secondary paths can be observed. In comparison with the fixed and adaptive ANR/ANC device it can clearly be seen that semi-adaptive ANR/ANC device embodiments disclosed herein show a better ANR/ANC performance compared to the fixed ANR/ANC device, and a more stable performance than the adaptive ANR/ANC device.

The person skilled in the art will understand that the "blocks" ("units") of the various figures (method and apparatus) represent or describe functionalities of embodiments of the present disclosure (rather than necessarily individual "units" in hardware or software) and thus describe equally functions or features of apparatus embodiments as well as method embodiments (unit=step).

In the several embodiments provided in the present application, it should be understood that the disclosed system, apparatus, and method may be implemented in other manners. For example, the described embodiment of an apparatus is merely exemplary. For example, the unit division is merely logical function division and may be another division in an actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

What is claimed is:

1. An audio controller for an active noise reduction (ANR) device, which is adapted for reducing an ambient noise signal, the audio controller comprising a processing circuitry configured to:

provide a fixed ANR filter, the fixed ANR filter being configured to generate a first noise reduction signal;

provide an adaptive ANR filter, the adaptive ANR filter comprising one or more adjustable filter coefficients for adapting the adaptive ANR filter and the adaptive ANR filter being configured to generate a second noise reduction signal;

generate a total noise reduction signal as an adjustable weighted linear combination of the first noise reduction signal and the second noise reduction signal;

generate the total noise reduction signal as the adjustable weighted linear combination of the first noise reduction signal and the second noise reduction signal based on an adjustable weighting coefficient a; and determine the adjustable weighting coefficient a based on the following equation:

$$a = \begin{cases} \dfrac{MM(e'(n))}{MM(e(n))} & \text{for } MM(e'(n)) \leq MM(e(n)) \\ 1 & \text{for } MM(e'(n)) > MM(e(n)) \end{cases}$$

wherein MM(x) denotes a magnitude measure of the argument vector x, n denotes a temporal sample index, e(n) denotes a total residual noise signal and e'(n) denotes a fractional residual noise signal.

2. The audio controller of claim 1, wherein the processing circuitry is further configured to determine a noise reduction estimate of the reduction of the ambient noise signal caused by the second noise reduction signal, and to determine the adjustable weighted linear combination based on the noise reduction estimate.

3. The audio controller of claim 1, wherein the processing circuitry is further configured to generate the total noise reduction signal as the adjustable weighted linear combination of the first noise reduction signal and the second noise reduction signal based on the following equation:

$$y = a y_{fixed} + (1-a) y_{adap},$$

wherein $y_{fixed}$ denotes the first noise reduction signal, $y_{adap}$ denotes the second noise reduction signal, and y denotes the total noise reduction signal.

4. The audio controller of claim 1, wherein the processing circuitry is further configured to determine the adjustable weighting coefficient a using a root mean square as the magnitude measure MM(x).

5. The audio controller of claim 1, wherein the processing circuitry is further configured to estimate a secondary path transfer function, wherein the secondary path transfer function describes the modification of the the total residual noise signal resulting in the fractional residual noise signal, and wherein the processing circuitry is further configured to determine the fractional residual noise signal based on the second noise reduction signal, the total residual noise signal, and the secondary path transfer function.

6. The audio controller of claim 1, wherein the processing circuitry is further configured to continually adjust the adjustable weighted linear combination of the first noise reduction signal and the second noise reduction signal for generating the total noise reduction signal, wherein initially the total noise reduction signal is equal to the first noise reduction signal.

7. The audio controller of claim 1, wherein the processing circuitry is further configured to adjust the one or more adjustable filter coefficients of the adaptive ANR filter based on a total residual noise signal.

8. An active noise reduction (ANR) device, the ANR device comprising the audio controller according to claim 1 and a loudspeaker, wherein the loudspeaker is configured to be driven based on the total noise reduction signal generated by the audio controller.

9. The ANR device of claim 8, wherein the ANR device further comprises a feedforward microphone configured to detect the ambient noise signal, wherein the fixed ANR filter is configured to generate the first noise reduction signal on the basis of the ambient noise signal, and wherein the adaptive ANR filter is configured to generate the second noise reduction signal on the basis of the ambient noise signal.

10. The ANR device of claim 8, wherein the ANR device further comprises a feedback microphone configured to detect a total residual noise signal, wherein the fixed ANR filter is configured to generate the first noise reduction signal on the basis of the total residual noise signal and wherein the adaptive ANR filter is configured to generate the second noise reduction signal on the basis of the total residual noise signal.

11. The ANR device of claim 8, wherein the ANR device further comprises a feedforward microphone configured to detect the ambient noise signal and a feedback microphone configured to detect a total residual noise signal, wherein the fixed ANR filter is configured to generate the first noise reduction signal on the basis of the ambient noise signal and the total residual noise signal and wherein the adaptive ANR filter is configured to generate the second noise reduction signal on the basis of the ambient noise signal and the total residual noise signal.

12. An active noise reduction (ANR) method for reducing an ambient noise signal, the method comprising:
  generating a first noise reduction signal with a fixed ANR filter;
  generating a second noise reduction signal with an adaptive ANR filter, wherein the adaptive ANR filter comprises one or more adjustable filter coefficients for adapting the adaptive ANR filter;
  generating a total noise reduction signal as an adjustable weighted linear combination of the first noise reduction signal and the second noise reduction signal;
  generating the total noise reduction signal as the adjustable weighted linear combination of the first noise reduction signal and the second noise reduction signal based on an adjustable weighting coefficient a; and
  determining the adjustable weighting coefficient a based on the following equation:

$$a = \begin{cases} \dfrac{MM(e'(n))}{MM(e(n))} & \text{for } MM(e'(n)) \le MM(e(n)) \\ 1 & \text{for } MM(e'(n)) > MM(e(n)) \end{cases}$$

wherein MM(x) denotes a magnitude measure of the argument vector x, n denotes a temporal sample index, e(n) denotes a total residual noise signal and e'(n) denotes a fractional residual noise signal.

13. A non-transitory computer-readable storage medium storing program code which is configured to cause a computer or a processor to perform the method of claim 12, when the program code is executed by the computer or the processor.

* * * * *